(12) United States Patent
Wu et al.

(10) Patent No.: US 12,193,212 B2
(45) Date of Patent: Jan. 7, 2025

(54) METHOD OF FORMING SEMICONDUCTOR DEVICE AND SEMICONDUCTOR DEVICE

(71) Applicant: CHANGXIN MEMORY TECHNOLOGIES, INC., Hefei (CN)

(72) Inventors: Feng Wu, Hefei (CN); Sangyeol Park, Hefei (CN)

(73) Assignee: CHANIGXIN MEMORY TECHNOLOGIES, INC., Hefei (CN)

( * ) Notice: Subject to any disclaimer, the term of this patent is extended or adjusted under 35 U.S.C. 154(b) by 448 days.

(21) Appl. No.: 17/454,863

(22) Filed: Nov. 15, 2021

(65) Prior Publication Data

US 2022/0310611 A1    Sep. 29, 2022

Related U.S. Application Data

(63) Continuation of application No. PCT/CN2021/112390, filed on Aug. 13, 2021.

(30) Foreign Application Priority Data

Mar. 24, 2021  (CN) .......................... 202110314338.4

(51) Int. Cl.
*H10B 12/00* (2023.01)
*H01L 21/768* (2006.01)
*H01L 23/528* (2006.01)

(52) U.S. Cl.
CPC ....... *H10B 12/30* (2023.02); *H01L 21/76877* (2013.01); *H01L 21/76897* (2013.01);
(Continued)

(58) Field of Classification Search
CPC ......... H01L 21/76877; H01L 21/76879; H01L 21/7688
See application file for complete search history.

(56) References Cited

U.S. PATENT DOCUMENTS 6,177,340 B1 * 1/2001 Yoo .................. H01L 21/76877
257/E21.585
6,235,620 B1 * 5/2001 Saito ................. H01L 21/76897
257/E21.507
(Continued)

FOREIGN PATENT DOCUMENTS

| CN | 105428360 A | 3/2016 |
|----|-------------|--------|
| CN | 111244065 A | 6/2020 |
| CN | 113078103 A | 7/2021 |

OTHER PUBLICATIONS

International Search report cited in PCT/CN2021/112390, mailed Dec. 29, 2021, 10 pages.

*Primary Examiner* — Evren Seven
(74) *Attorney, Agent, or Firm* — Kilpatrick Townsend & Stockton LLP

(57) ABSTRACT

The present disclosure provides a method of forming a semiconductor device and a semiconductor device. The method of forming a semiconductor device includes the following steps: providing a base, where the base includes a substrate and an array region located above the substrate, and the array region includes a first semiconductor structure and a first dielectric layer that covers a surface of the first semiconductor structure; forming, in the first dielectric layer, a groove exposing the first semiconductor structure, where the groove runs through the first dielectric layer along a direction parallel to a surface of the substrate; and filling the groove with a conductive material to form an array contact line.

13 Claims, 5 Drawing Sheets

(52) U.S. Cl.
CPC ......... *H01L 23/5283* (2013.01); *H10B 12/02* (2023.02); *H10B 12/50* (2023.02)

(56) References Cited

U.S. PATENT DOCUMENTS

| | | | |
|---|---|---|---|
| 6,576,509 B1* | 6/2003 | Toyokawa | H01L 21/76877 257/E21.507 |
| 7,494,866 B2* | 2/2009 | Ko | H10B 53/30 257/295 |
| 10,304,852 B1 | 5/2019 | Cui et al. | |
| 2001/0023953 A1* | 9/2001 | Schuegraf | H01L 21/76843 257/E21.585 |
| 2002/0123216 A1* | 9/2002 | Yokoyama | H01L 21/76877 257/E21.585 |
| 2012/0205779 A1* | 8/2012 | Kim | H10B 12/033 257/532 |
| 2016/0079240 A1 | 3/2016 | Sugita | |

* cited by examiner

METHOD OF FORMING SEMICONDUCTOR DEVICE AND SEMICONDUCTOR DEVICE

CROSS-REFERENCE TO RELATED APPLICATIONS

This is a continuation of International Patent Application No. PCT/CN2021/112390, filed on Aug. 13, 2021, which claims the priority to Chinese Patent Application No. 202110314338.4, titled "METHOD OF FORMING SEMICONDUCTOR DEVICE AND SEMICONDUCTOR DEVICE" and filed on Mar. 24, 2021. The entire contents of International Patent Application No. PCT/CN2021/112390 and Chinese Patent Application No. 202110314338.4 are incorporated herein by reference.

TECHNICAL FIELD

The present disclosure relates to, but is not limited to, a method of forming a semiconductor device and a semiconductor device.

BACKGROUND

As a semiconductor device commonly used in an electronic device such as a computer, a dynamic random access memory (DRAM) includes a plurality of memory cells, and each memory cell usually includes a transistor and a capacitor. The transistor has a gate electrically connected to a word line, a source electrically connected to a bit line, and a drain electrically connected to the capacitor. A word line voltage on the word line can control on and off of the transistor, such that data information stored in the capacitor can be read through the bit line or data information can be written into the capacitor through the bit line.

As a size of the semiconductor becomes more miniaturized, a resistance of a connecting plug located in a through hole in a semiconductor device such as a DRAM has an increasing impact on an operating current of the semiconductor device. The semiconductor device such as the DRAM usually includes an array region and a peripheral region located outside the array region. Both the array region and the peripheral region need to be connected to external electrical signals through through-hole plugs. However, due to a thickness difference between covering layers of the array region and the peripheral region, a semiconductor manufacturing process becomes more difficult. In addition, in the method of connecting to an external electrical signal through a through-hole plug in the array region, a contact resistance of the array region is increased, affecting electrical performance of the semiconductor device such as the DRAM.

SUMMARY

An overview of the subject matter detailed in the present disclosure is provided below, which is not intended to limit the protection scope of the claims.

The present disclosure provides a method of forming a semiconductor device and a semiconductor device.

A first aspect of the present disclosure provides a method of forming a semiconductor device, including the following steps:

providing a base, where the base includes a substrate and an array region located above the substrate, and the array region includes a first semiconductor structure and a first dielectric layer that covers a surface of the first semiconductor structure;

forming, in the first dielectric layer, a groove exposing the first semiconductor structure, where the groove runs through the first dielectric layer along a direction parallel to a surface of the substrate; and filling the groove with a conductive material to form an array contact line.

A second aspect of the present disclosure provides a semiconductor device, including:

a substrate, where the substrate has an array region, and the array region includes a first semiconductor structure and a first dielectric layer that covers a surface of the first semiconductor structure; and an array contact line, located in the first dielectric layer and in electrical contact with the first semiconductor structure, where the array contact line runs through the first dielectric layer along a direction parallel to a surface of the substrate.

Other aspects of the present disclosure are understandable upon reading and understanding of the drawings and detailed description.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these drawings, similar reference numerals are used to represent similar elements. The drawings in the following description are part rather than all of the embodiments of the present disclosure. Those skilled in the art may derive other drawings based on these drawings without creative efforts.

DETAILED DESCRIPTION

The technical solutions in the embodiments of the present disclosure are described below clearly and completely with reference to the drawings in the embodiments of the present disclosure. Apparently, the described embodiments are merely part rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
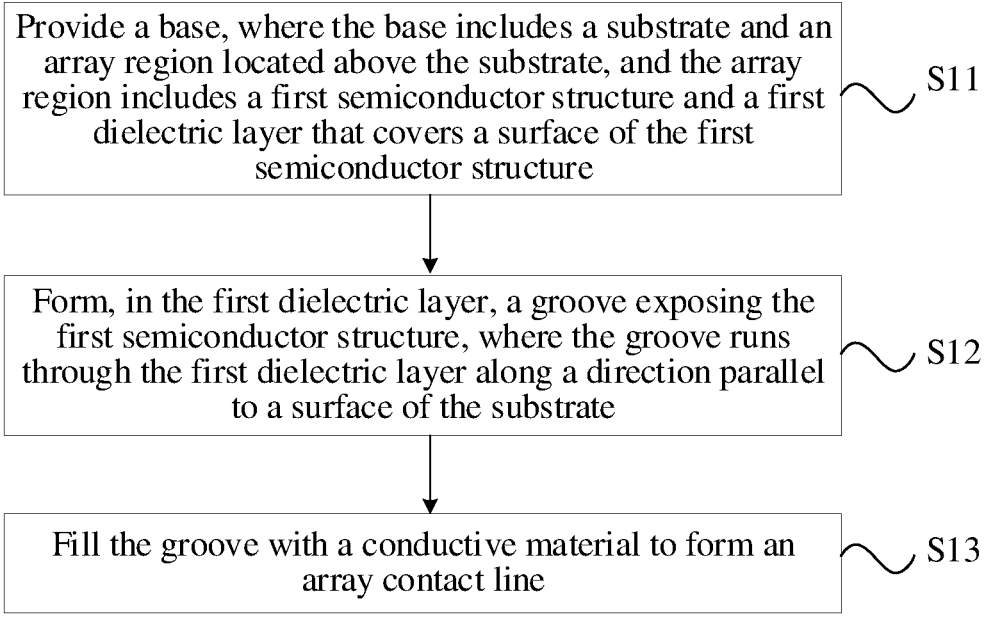
FIG. 1 is a flowchart of a method of forming a semiconductor device according to an implementation of the present disclosure.
Figure 2A:
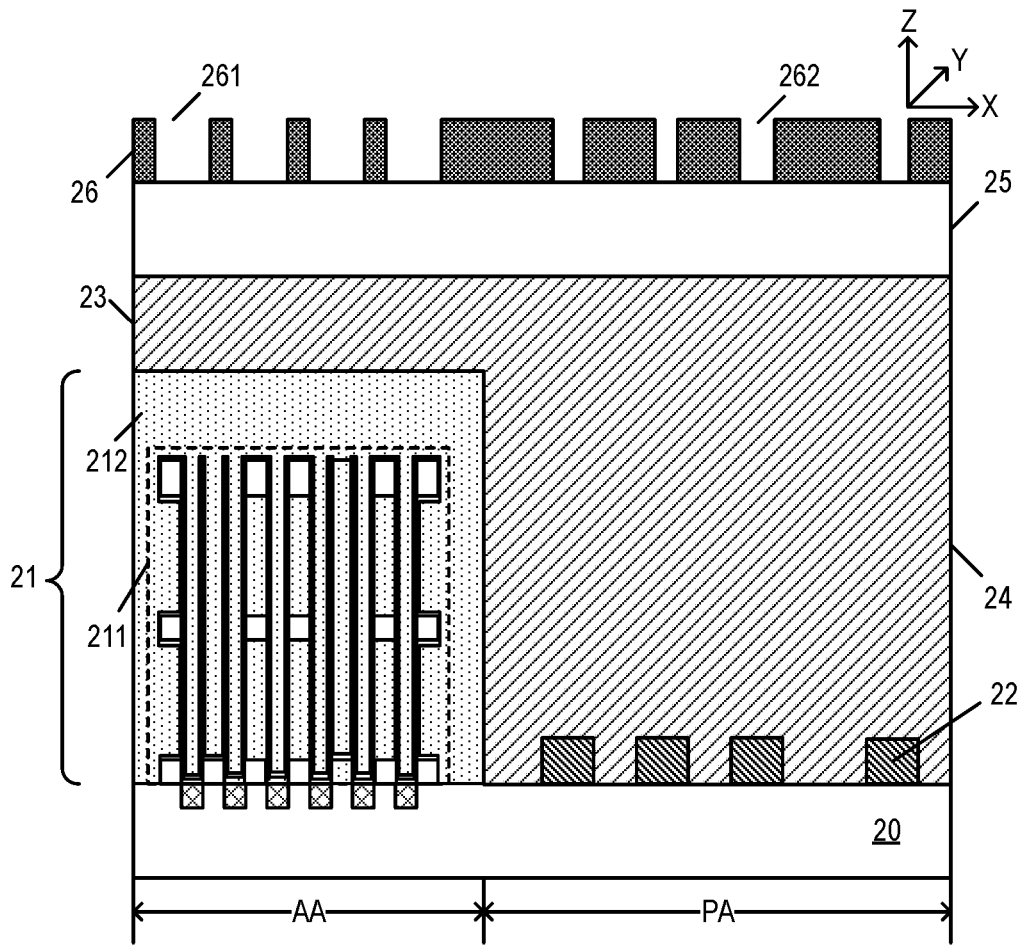
FIG. 2A to FIG. 2F are each a schematic cross-sectional view of a main process during formation of a semiconductor device according to an implementation of the present disclosure.

An implementation of the present disclosure provides a semiconductor device. FIG. 1 is a flowchart of a method of forming a semiconductor device according to an implementation of the present disclosure. FIG. 2A to FIG. 2F are each a schematic cross-sectional view of a main process during formation of a semiconductor device according to an implementation of the present disclosure. As shown in FIG. 1 and FIG. 2A to FIG. 2F, the method of forming a semiconductor device provided in this implementation includes the following steps:

Step S11. Provide a base, where the base includes a substrate 20 and an array region AA located above the substrate 20, and the array region AA includes a first semiconductor structure 21 and a first dielectric layer 23 that covers a surface of the first semiconductor structure 21, as shown in FIG. 2A.

In an exemplary implementation, the substrate 20 may be a Si substrate, a Ge substrate, a SiGe substrate, a silicon on insulator (SOI), a germanium on insulator (GOI), or the like. In this implementation, that the substrate 20 is a Si substrate is used as an example for description. The substrate 20 corresponding to the array region AA has a plurality of active regions arranged in an array. Adjacent active regions are electrically isolated by a shallow trench isolation (STI) structure.

Step S12. Form, in the first dielectric layer 23, a groove 231 exposing the first semiconductor structure 21, where the groove 231 runs through the first dielectric layer 23 along a direction parallel to a surface of the substrate 20, as shown in FIG. 2C.

Figure 2B:
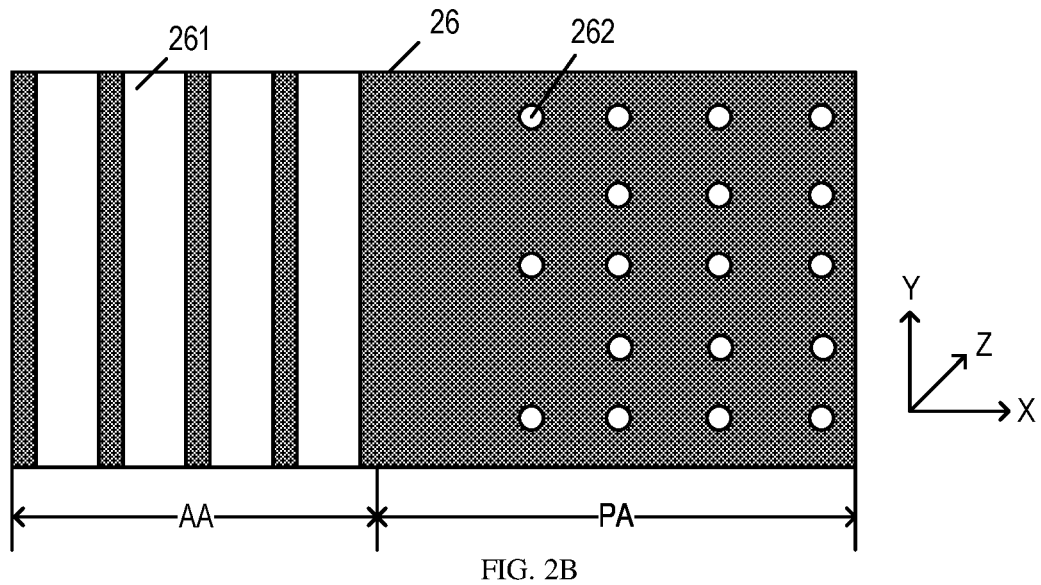
Figure 2C:
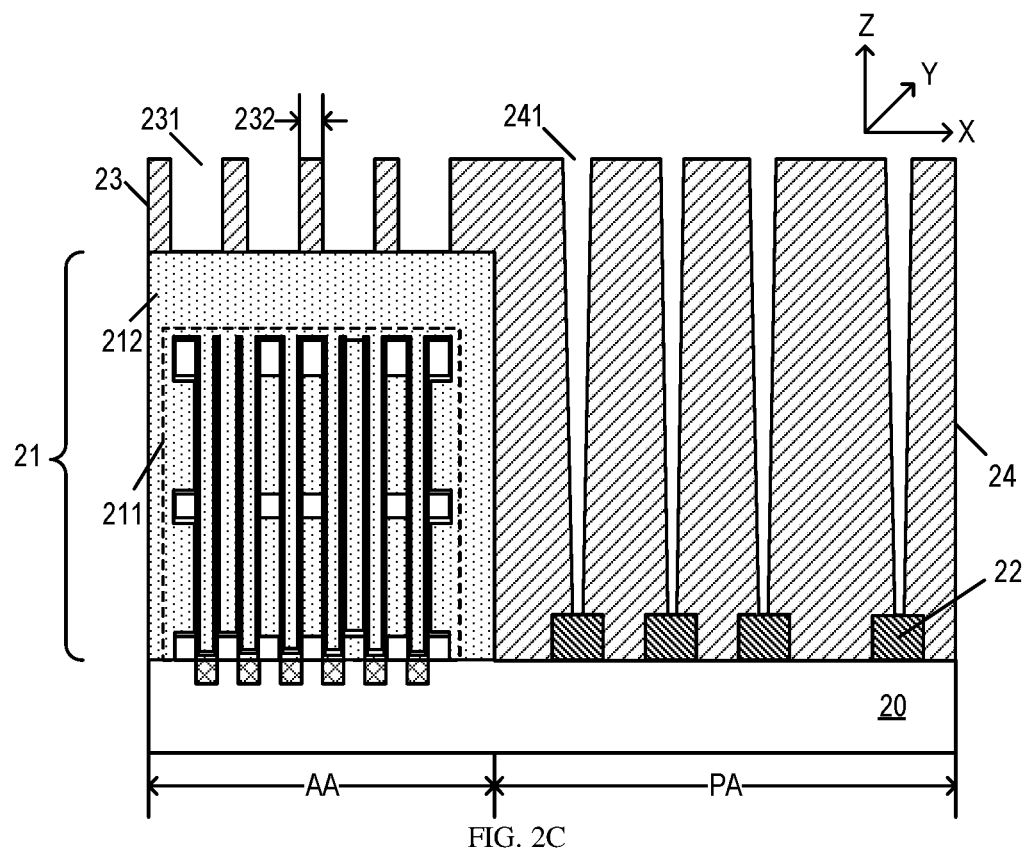

In an exemplary implementation, a peripheral region PA located outside the array region AA is further provided above the substrate 20. The peripheral region PA includes a second semiconductor structure 22 and a second dielectric layer 24 that covers a surface of the second semiconductor structure 22. The step of forming, in the first dielectric layer 23, a groove exposing the first semiconductor structure 21 includes:

forming, in the first dielectric layer 23, the groove 231 exposing the first semiconductor structure 21, and forming, in the second dielectric layer 24, a through hole 241 exposing the second semiconductor structure 22, as shown in FIG. 2C.

In an exemplary implementation, the peripheral region PA may be located only on one side of the array region AA, or may be provided around an outer circumference of the array region AA. The second semiconductor structure 22 includes a CMOS circuit structure, or the like. The second semiconductor structure 22 is used to transmit a drive signal to the first semiconductor structure 21. After the first semiconductor structure 21 and the second semiconductor structure 22 are formed on the surface of the substrate 20, a dielectric material such as oxide may be deposited on the surfaces of the first semiconductor structure 21 and the second semiconductor structure 22, and both the first dielectric layer 23 and the second dielectric layer 24 are formed, that is, the first dielectric layer 23 and the second dielectric layer 24 may be made of a same material and formed simultaneously. Along a direction perpendicular to the substrate 20 (that is a Z-axis direction in FIG. 2A), a height of the first dielectric layer 23 is less than a height of second dielectric layer 24. The height of the first dielectric layer 23 is a vertical distance between a bottom surface of the first dielectric layer 23 and a top surface of the first dielectric layer 23. The height of the second dielectric layer 24 is a vertical distance between a bottom surface of the second dielectric layer 24 and a top surface of the second dielectric layer 24. In other implementations, those skilled in the art may alternatively form the first dielectric layer 23 and the second dielectric layer 24 according to actual needs.

Figure 2D:
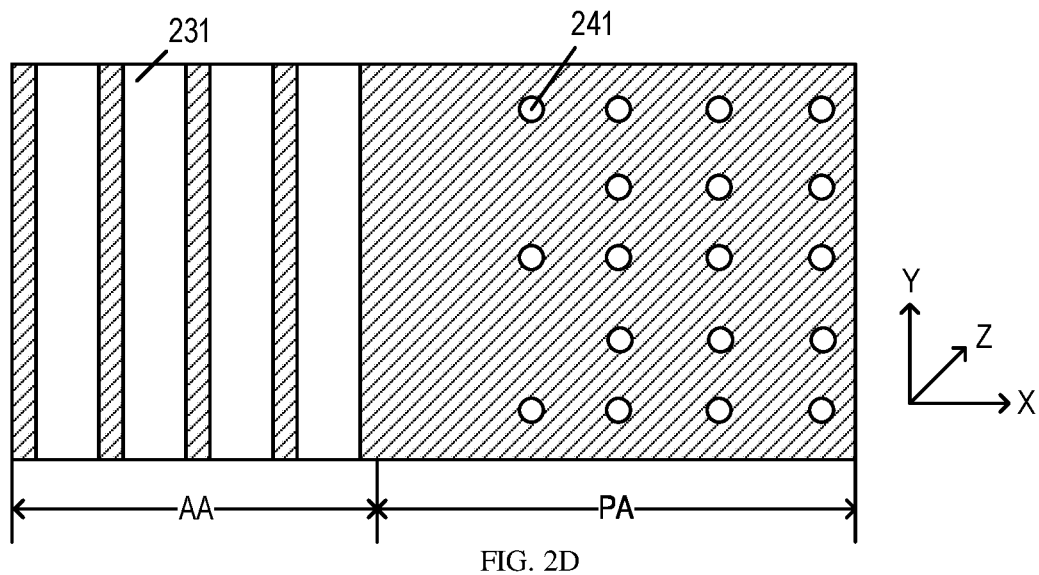

After the first dielectric layer 23 and the second dielectric layer 24 are formed, a mask layer 25 that covers the first dielectric layer 23 and the second dielectric layer 24 and a photoresist layer 26 that is located on a surface of the mask layer 25 are formed. The photoresist layer 26 has a first opening 261 corresponding to the array region AA and a second opening 262 corresponding to the peripheral region PA, as shown in FIG. 2A and FIG. 2B. FIG. 2B is a schematic structural top view of FIG. 2A. Subsequently, the mask layer 25, the first dielectric layer 23, and the second dielectric layer 24 are etched along the first opening 261 and the second opening 262 by using a dry etching process or the like, the groove 231 running through the first dielectric layer 23 along the direction (that is, a Z-axis direction in FIG. 2A and FIG. 2B) perpendicular to the substrate 20 is formed in the array region AA, and the through hole 241 running through the second dielectric layer 24 along the direction perpendicular to the substrate 20 is formed in the peripheral region PA at the same time. After the mask layer 25 and the photoresist layer 26 are removed, the structure shown in FIG. 2C and FIG. 2D is obtained, and FIG. 2D is a schematic structural top view of FIG. 2C.

In an exemplary implementation, the groove 231 runs through the first dielectric layer 23 along the direction which is parallel to the surface of the substrate 20 and is perpendicular to a direction of the peripheral region PA pointing to the array region AA.

In an exemplary implementation, the step of forming, in the first dielectric layer 23, a groove 231 exposing the first semiconductor structure 21 includes:

forming, in the first dielectric layer 23, a plurality of grooves 231 exposing the first semiconductor structure 21, where the plurality of grooves 231 are arranged in parallel along the direction in which the peripheral region PA points to the array region AA, and a gap 232 is provided between adjacent grooves 231.

In an exemplary implementation, as shown in FIG. 2C and FIG. 2D, the array region AA has a plurality of grooves 231, and the plurality of grooves 231 are arranged in parallel along an X-axis direction, and each groove 231 extends along a Y-axis direction and runs through the first dielectric layer 23 along the Y-axis direction. The gap 232 is provided between adjacent grooves 231, and the gap 232 fills the first dielectric layer 23.

This implementation is described by using an example in which the groove 231 runs through the first dielectric layer 23 along a direction which is parallel to the surface of the substrate 20 and is perpendicular to the direction of the peripheral region PA pointing to the array region AA. Those skilled in the art may alternatively cause a length of the groove along the Y-axis direction to be less than a length of the first dielectric layer 23 along the Y-axis direction according to actual needs, so as to avoid etching of an edge region of the first dielectric layer 23, to ensure edge topography of the first dielectric layer 23.

This implementation is described by using an example in which the groove 231 extends along a direction parallel to the surface of the substrate 20 and perpendicular to the direction in which the peripheral region PA points to the array region AA. Those skilled in the art may alternatively cause, according to actual need, the groove 231 to extend along a direction parallel to the direction in which the peripheral region PA points to the array region AA, that is, cause the groove 231 to extend along the X-axis direction. In this case, the plurality of grooves 231 are arranged in parallel along the direction parallel to the surface of the substrate 20 and perpendicular to the direction in which the peripheral region PA points to the array region AA. In this case, along the X-axis direction, a length of the groove 231 may be less than or equal to a length of the first dielectric layer 23.

In an exemplary implementation, a width of the groove 231 is greater than a width of the through hole 241.

For example, as shown in FIG. 2C and FIG. 2D, the width of the groove 231 is a length of the groove 231 along the direction in which the peripheral region PA points to the array region AA (that is, the X-axis direction). The width of the through hole 241 is a length of the through hole 241 along the direction in which the peripheral region PA points to the array region AA (that is, the X-axis direction), that is, the width of the through hole 241 is an inner diameter of the through hole 241.

This implementation is described by using an example in which the groove 231 extends to a top surface of the first semiconductor structure 21 (that is, a surface of the first semiconductor structure 21 facing away from the substrate 20), such that etching steps can be simplified.

In an exemplary implementation, the first semiconductor structure 21 includes a capacitor array 211 and a conductive covering layer 212 that covers the capacitor array 211, and the first dielectric layer 23 covers a surface of the conductive covering layer 212.

The groove 231 runs through the first dielectric layer 23 along a direction perpendicular to the substrate 20 and extends into the conductive covering layer 212.

In an exemplary implementation, the semiconductor device may be a DRAM. The capacitor array 211 includes a plurality of capacitors arranged in an array. The conductive covering layer 212 wraps around the capacitor array 211, to fill a void in the capacitor array 211. A material of the conductive covering layer 212 may be polycrystalline silicon or SiGe. The groove 231 runs through the first dielectric layer 23 along the direction perpendicular to the substrate 20 and extends into the conductive covering layer 212, such that an impact of a natural oxide layer that may exist on the surface of the conductive covering layer 212 on electrical signal conduction in the array region AA can be avoided, but also a contact area between a subsequently formed array contact line 27 and the first semiconductor structure 21 (for example, the conductive covering layer 212) can be increased, thereby reducing a contact resistance.

Figure 2E:
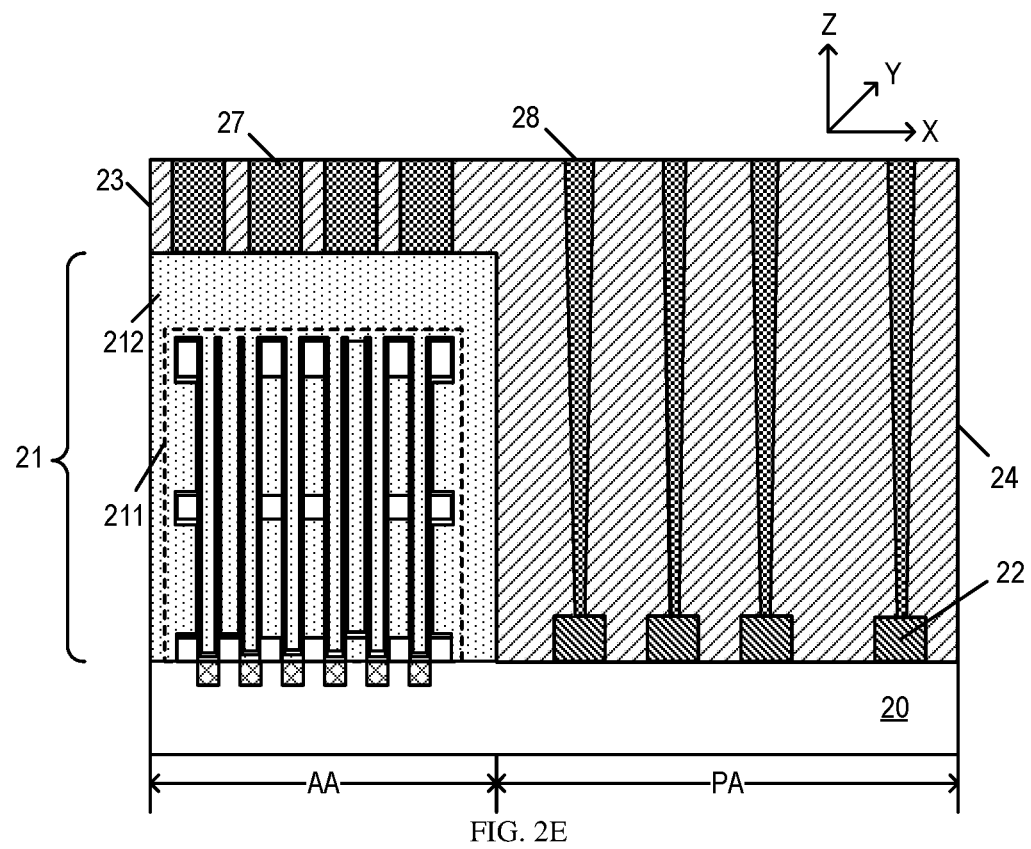

Step S13. Fill the groove 231 with a conductive material to form an array contact line 27, as shown in FIG. 2E.

In an exemplary implementation, the step of filling the groove 231 with a conductive material includes:
 filling both the groove 231 and the through hole 241 with the conductive material, to form the array contact line 27 in the groove 231 and to form a peripheral contact plug 28 in the through hole 241 simultaneously.

In an exemplary implementation, the step of filling the groove with a conductive material includes:
 depositing the conductive material in the groove 231, on a surface of the first dielectric layer 23, in the through hole 241, and on a surface of the second dielectric layer 24; and
 removing the conductive material that covers the surface of the first dielectric layer 23 and the surface of the second dielectric layer 24.

Figure 2F:
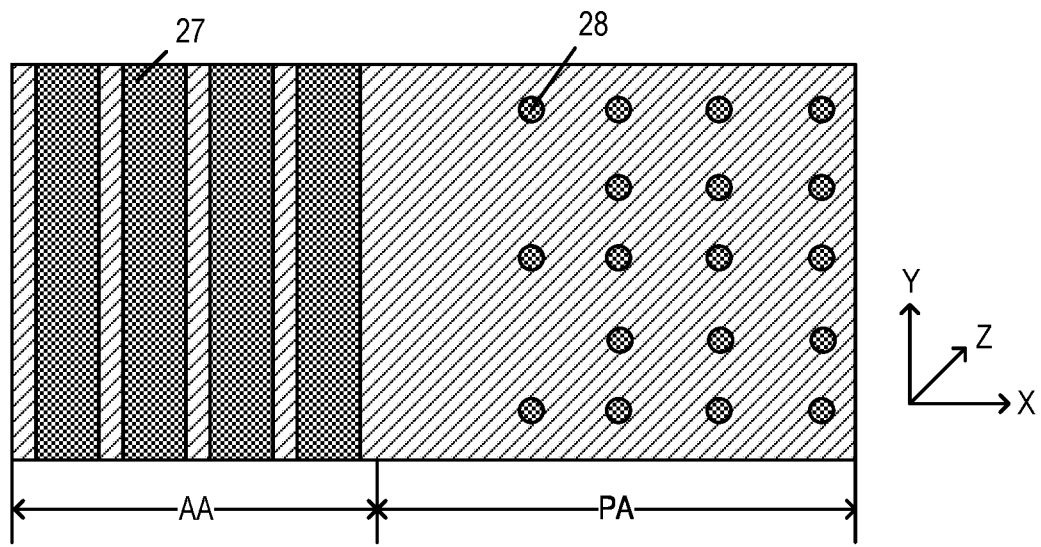

In an exemplary implementation, after the groove 231 and the through hole 241 are formed, a conductive material such as tungsten is deposited in the groove 231, on the surface of the first dielectric layer 23, in the through hole 241, and on the surface of the second dielectric layer 24. Subsequently, the conductive material that covers the surface of the first dielectric layer 23 and the surface of the second dielectric layer 24 is removed by using a planarization process such as chemical mechanical polishing, the conductive material remaining in the groove 231 forms the array contact line 27, and the conductive material remaining in the through hole 241 forms the peripheral contact plug 28, as shown in FIG. 2E and FIG. 2F. FIG. 2F is a schematic structural top view of FIG. 2E.

In other implementations, before the deposition of the conductive material, a first diffusion barrier layer may be formed in the groove 231, and a second diffusion barrier layer may be formed in the through hole 241 at the same time. Subsequently, an array contact line 27 that fills the groove 231 and covers a surface of the first diffusion barrier layer is formed, and a peripheral contact plug 28 that fills the through hole 241 and covers a surface of the second diffusion barrier layer is formed. A material of the first diffusion barrier layer and the second diffusion barrier layer may be TiN, or the like.

When there are a plurality of grooves 231, and a gap 232 is provided between adjacent grooves 231, because a material of a first dielectric layer 23 in the gap 232 has a different stress from the conductive material, a loading effect in a planarization process such as chemical mechanical polishing can be reduced, and defects can be avoided in the array contact line 27. The array contact line in the present disclosure not only can increase the process window and reduce the process difficulty, but also can reduce an on resistance in the array region.

Figure 3A:
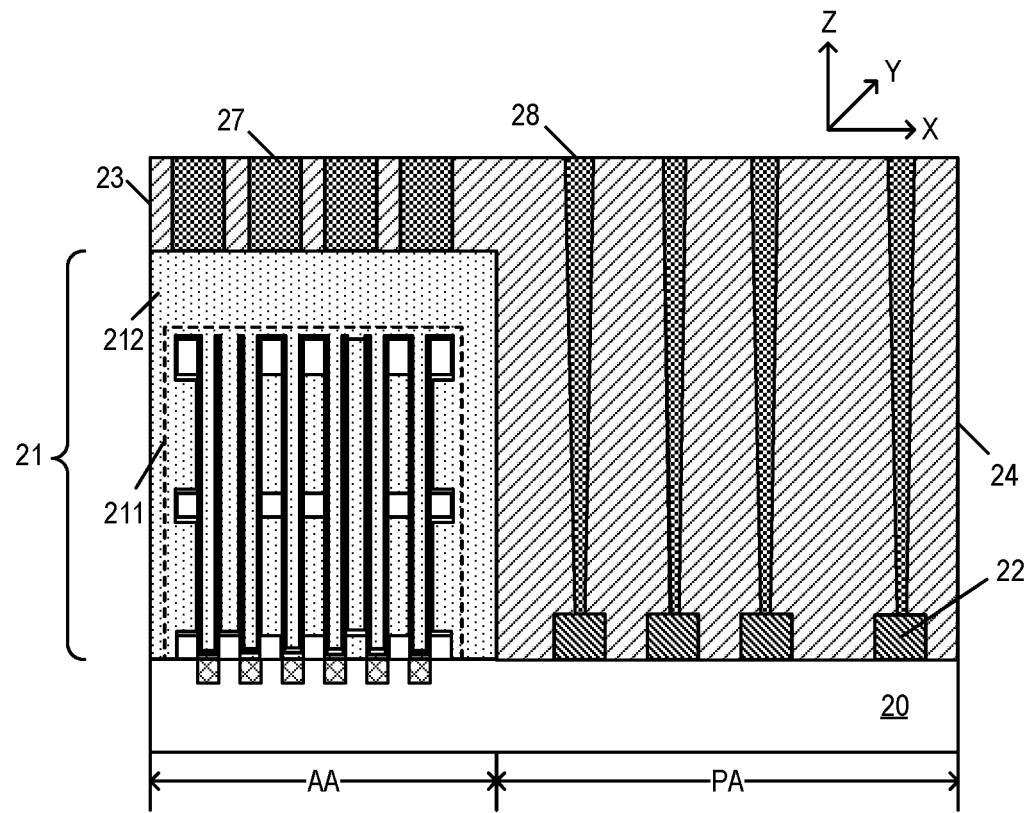
FIG. 3A and FIG. 3B are each a schematic structural diagram of a semiconductor device according to an implementation of the present disclosure.
Figure 3B:
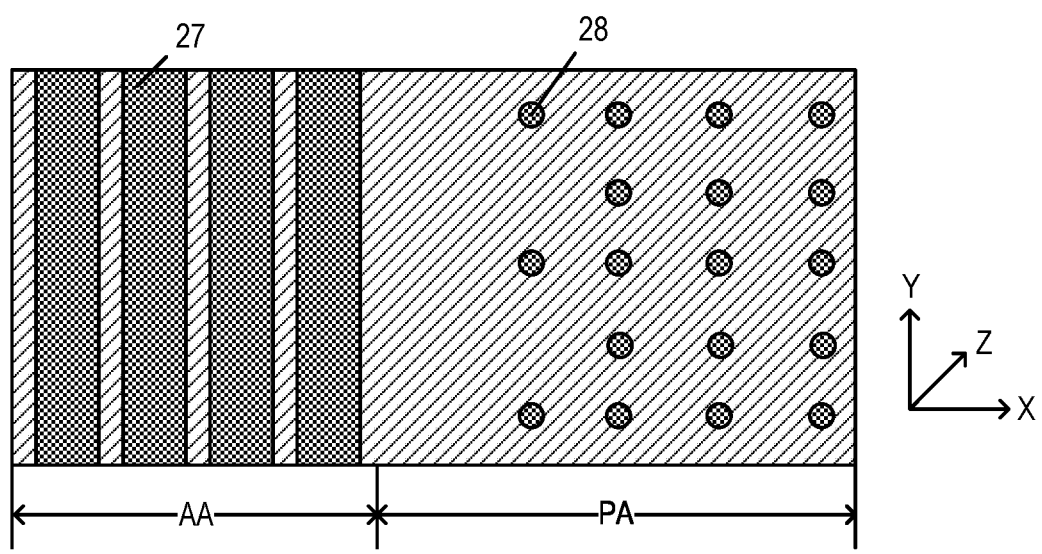

An implementation of the present disclosure further provides a semiconductor device. FIG. 3A and FIG. 3B are each a schematic structural diagram of a semiconductor device according to an implementation of the present disclosure. The semiconductor device provided in this implementation may be formed by using the method shown in FIG. 1 and FIG. 2A to FIG. 2F. As shown in FIG. 3A and FIG. 3B, the semiconductor device includes:
 a substrate 20, where the substrate 20 has an array region AA, and the array region AA includes a first semiconductor structure 21 and a first dielectric layer 23 that covers a surface of the first semiconductor structure 21; and
 an array contact line 27, located in the first dielectric layer 23 and in electrical contact with the first semiconductor structure 21, where the array contact line 27 runs through the first dielectric layer 23 along a direction parallel to a surface of the substrate 20.

In an exemplary implementation, a peripheral region PA located outside the array region AA is further provided above the substrate 20, and the peripheral region PA includes a second semiconductor structure 22 and a second dielectric layer 24 that covers a surface of the second semiconductor structure 22; and the semiconductor device further includes:
 a peripheral contact plug 28, located in the second dielectric layer 24 and electrically connected to the second semiconductor structure 22.

In an exemplary implementation, a width of the array contact line 27 is greater than a width of the peripheral contact plug 28.

For example, as shown in FIG. 3A and FIG. 3B, the width of the array contact line 27 is a length of the array contact line 27 along an X-axis direction, and the width of the peripheral contact plug 28 is a length of the peripheral contact plug 28 along the X-axis direction (that is, a diameter of the peripheral contact plug 28).

In an exemplary implementation, the array contact line 27 runs through the first dielectric layer 23 along a direction parallel to the surface of the substrate 20 and perpendicular to a direction in which the peripheral region PA points to the array region AA.

In an exemplary implementation, there are a plurality of array contact lines 27, and the plurality of array contact lines 27 are arranged in parallel along the direction in which the peripheral region PA points to the array region AA, and a gap 232 is provided between adjacent array contact lines 27.

In an exemplary implementation, a material of the array contact line 27 is the same as a material of the peripheral contact plug 28.

In an exemplary implementation, the first semiconductor structure 21 includes a capacitor array 211 and a conductive covering layer 212 that covers the capacitor array 211, and the first dielectric layer 23 covers a surface of the conductive covering layer 212.

The array contact line 27 runs through the first dielectric layer 23 along a direction perpendicular to the substrate 20 and extends into the conductive covering layer 212.

According to the method of forming a semiconductor device and the semiconductor device provided in this implementation of the present disclosure, a groove running through a first dielectric layer above a first semiconductor structure along a direction parallel to a surface of a substrate is formed in an array region, such that a finally formed array contact line is a straight or a linear structure. Compared with the conventional through-hole type array contact structure, the array contact line in the present disclosure not only can increase a process window and reduce process difficulty, but also can reduce an on resistance in the array region (a contact resistance between the array contact line and the first semiconductor structure is less than a contact resistance between the through-hole type array contact structure and the first semiconductor structure), thereby improving electrical properties of the semiconductor device.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

According to the method of forming a semiconductor device and the semiconductor device provided in the embodiments of the present disclosure, a groove running through a first dielectric layer above a first semiconductor structure along a direction parallel to a surface of a substrate is formed in an array region, such that a finally formed array contact line is a straight or a linear structure. Compared with the conventional through-hole type array contact structure, the array contact line in the present disclosure not only can increase a process window and reduce process difficulty, but also can reduce an on resistance in the array region (a contact resistance between the array contact line and the first semiconductor structure is less than a contact resistance between the through-hole type array contact structure and the first semiconductor structure), thereby improving electrical properties of the semiconductor device.

The invention claimed is:
1. A method of forming a semiconductor device, comprising the following steps:
providing a substrate, an array region located above the substrate, wherein the array region comprises a first semiconductor structure and a first dielectric layer that covers a surface of the first semiconductor structure, the first semiconductor structure comprises a capacitor array and a conductive covering layer that covers the capacitor array, and the first dielectric layer covers a surface of the conductive covering layer;
forming, in the first dielectric layer, a groove exposing the first semiconductor structure, wherein the groove runs through the first dielectric layer along a direction parallel to a surface of the substrate, the groove runs through the first dielectric layer along a direction perpendicular to the substrate and extends into the conductive covering layer; and
filling the groove with a conductive material to form an array contact line.

2. The method of forming a semiconductor device according to claim 1, wherein a peripheral region located outside the array region is further provided above the substrate, and the peripheral region comprises a second semiconductor structure and a second dielectric layer that covers a surface of the second semiconductor structure; and the step of forming, in the first dielectric layer, a groove exposing the first semiconductor structure comprises:
forming, in the first dielectric layer, the groove exposing the first semiconductor structure, and forming, in the second dielectric layer, a through hole exposing the second semiconductor structure.

3. The method of forming a semiconductor device according to claim 2, wherein a width of the groove is greater than a width of the through hole.

4. The method of forming a semiconductor device according to claim 2, wherein the groove runs through the first dielectric layer along a direction which is parallel to the surface of the substrate and is perpendicular to a direction of the peripheral region pointing to the array region.

5. The method of forming a semiconductor device according to claim 4, wherein the step of forming, in the first dielectric layer, a groove exposing the first semiconductor structure comprises:
forming, in the first dielectric layer, a plurality of grooves exposing the first semiconductor structure, wherein the plurality of grooves are arranged in parallel along a direction in which the peripheral region points to the array region, and a gap is provided between adjacent grooves.

6. The method of forming a semiconductor device according to claim 2, wherein the step of filling the groove with a conductive material comprises:
filling both the groove and the through hole with the conductive material, to form the array contact line in the groove and to form a peripheral contact plug in the through hole simultaneously.

7. The method of forming a semiconductor device according to claim 6, wherein the step of filling the groove with a conductive material comprises:
depositing the conductive material in the groove, on a surface of the first dielectric layer, in the through hole, and on a surface of the second dielectric layer; and
removing the conductive material that covers the surface of the first dielectric layer and the surface of the second dielectric layer.

8. A semiconductor device, comprising:
a substrate, wherein the substrate has an array region, and the array region comprises a first semiconductor structure and a first dielectric layer that covers a surface of the first semiconductor structure, the first semiconductor structure comprises a capacitor array and a conductive covering layer that covers the capacitor array, and the first dielectric layer covers a surface of the conductive covering layer;
a groove, wherein the groove runs through the first dielectric layer along a direction parallel to a surface of the substrate; and
an array contact line, located in the groove and in electrical contact with the first semiconductor structure, wherein the array contact line runs through the first dielectric layer along a direction parallel to a surface of the substrate; the array contact line runs through the first dielectric layer along a direction perpendicular to the substrate and extends into the conductive covering layer.

9. The semiconductor device according to claim 8, wherein a peripheral region located outside the array region is further provided above the substrate, and the peripheral region comprises a second semiconductor structure and a second dielectric layer that covers a surface of the second semiconductor structure; and the semiconductor device further comprises:
a peripheral contact plug, located in the second dielectric layer and electrically connected to the second semiconductor structure.

10. The semiconductor device according to claim 9, wherein a width of the array contact line is greater than a width of the peripheral contact plug.

11. The semiconductor device according to claim 9, wherein the array contact line runs through the first dielectric layer along a direction which is parallel to the surface of the substrate and is perpendicular to a direction of the peripheral region pointing to the array region.

12. The semiconductor device according to claim 11, wherein there are a plurality of array contact lines, and the plurality of array contact lines are arranged in parallel along the direction in which the peripheral region points to the array region, and a gap is provided between adjacent array contact lines.

13. The semiconductor device according to claim 9, wherein a material of the array contact line is the same as a material of the peripheral contact plug.

* * * * *